United States Patent [19]
Trah et al.

[11] Patent Number: 5,242,533
[45] Date of Patent: Sep. 7, 1993

[54] METHOD OF STRUCTURING A SEMICONDUCTOR CHIP

[75] Inventors: Hans-Peter Trah, Reutlingen; Guenther Findler, Stuttgart; Joerg Muchow, Reutlingen, all of Fed. Rep. of Germany

[73] Assignee: Robert Bosch GmbH, Stuttgart, Fed. Rep. of Germany

[21] Appl. No.: 828,033

[22] Filed: Jan. 30, 1992

[30] Foreign Application Priority Data

Mar. 5, 1991 [DE] Fed. Rep. of Germany ....... 4106933

[51] Int. Cl.⁵ .................. H01L 21/306; B44C 1/22
[52] U.S. Cl. .................. 156/628; 156/647; 156/657; 156/659.1; 156/661.1; 156/662
[58] Field of Search .............. 156/628, 636, 647, 651, 156/657, 659.1, 661.1, 662; 437/228; 204/129.65

[56] References Cited

U.S. PATENT DOCUMENTS

| | | | |
|---|---|---|---|
| 4,672,354 | 6/1987 | Kurtz et al. | 156/633 X |
| 4,783,237 | 11/1988 | Aine et al. | 156/647 X |
| 4,966,649 | 10/1990 | Harada et al. | 156/647 |
| 5,129,983 | 7/1992 | Greiff | 156/628 |

OTHER PUBLICATIONS

Anton Heuberger, *Micromechanik*, 1989, pp. 90–121 & 146–151, published by Springer Verlag, Berlin-Heidelberg—N.Y.—Paris—Tokyo.

*Primary Examiner*—William A. Powell
*Attorney, Agent, or Firm*—Frishauf, Holtz, Goodman & Woodward

[57] ABSTRACT

Processes are proposed for structuring monocrystalline semiconductor substrates provided with a basic doping, in particular silicon substrates with a (100) or (110) crystal orientation. In this process, at least one main surface of the semiconductor substrate is passivated by means of a structured masking layer, and in an etching step etching into the semiconductor substrate is done anisotropically through openings in the masking layer. It is proposed that as the masking layer (12), a structured, preferably monocrystalline, layer of the basic material of the semiconductor substrate be used, which is doped such that a pn junction is produced between the masking layer (12) and the semiconductor substrate (10), the junction being polarized in the depletion direction and serving as an etch stop. It is also proposed that the semiconductor substrate (10) be formed of a substrate (11) and at least one layer (13), applied thereon, with buried zones (16), with pn junctions being produced between the zones (16) and the substrate (11). Zones (16) that are electrically insulated from one another and the semiconductor substrate (10) are electrically bonded, so that the pn junctions are polarized in the depletion direction and serve as an etch stop for deep etching.

11 Claims, 4 Drawing Sheets

METHOD OF STRUCTURING A SEMICONDUCTOR CHIP

CROSS-REFERENCE TO RELATED PATENTS AND APPLICATIONS, ASSIGNED TO THE ASSIGNEE OF THE PRESENT INVENTION, THE DISCLOSURES OF WHICH ARE HEREBY INCORPORATED BY REFERENCE

U.S. Pat. No. 4,522,067 and 4,620,365, BURGER.

U.S. Pat. No. 5,005,414, HOLLAND et al. (=DE-OS 38 14 950)

U.S. Pat. No. 4,955,234, MAREK, issued Sep. 11, 1990=DE 38 14 952;

U.S. Pat. No. 5,071,510 FINDLER & MUENZEL, issued Dec. 10, 1991, corresponding to German P 39 31 590.9 of Sep. 22, 1989 and German application P 40 02 472.0 of Feb. 6, 1990, U.S. Ser. No. 07/631,623, U.S. Pat. No. 5,151,763, MAREK, BANTIEN, HAACK & WARTH, corresponding to German Patent DE-PS 40 00 903 of Aug. 9, 1990, U.S. Ser. No. 07/716,817, MAREK, filed Jun. 17, 1991, abandoned, corresponding to German P 40 22 464.3, filed Jul. 14, 1990

German Patent Disclosure DE 36 09 841, filed Mar. 22, 1989, and Published International Application WO 87-05569, HEINTZ et al; ENGELSDORF & METTNER, German Patent Disclosure DE-OS 39 19 876, publ. Dec. 20, 1990, and corresponding PCT/DE90/00366, publ. Dec. 27, 1990 as WO 90-15933;

U.S. Ser. No. 07/566,997, METTNER et al., filed Aug. 13, 1990, now U.S. Pat. No. 5,142,781, issued Sep. 1, 1992, and corresponding PCT/EP90/01297, publ. as WO 91-02169;

German Patent Disclosure DE 40 41 579.1 and corresponding U.S. Ser. No. 07/800,491, METTNER, filed Nov. 29, 1991, U.S. Pat. No. 5,178,190;

German Patent Disclosure DE 40 16 472.1 and corresponding U.S. Ser. No. 07/701,880, BANTIEN filed May 17, 1991;

German Patent Disclosure DE 40 16 471.3 and corresponding U.S. Ser. No. 07/701,781, BANTIEN, filed May 17, 1991, U.S. Pat. No. 5,148,604;

German Patent Application P 40 22 495.3, filed July 1990;

German Patent Disclosure DE 40 28 402.6 and corresponding U.S. Ser. No. 07/750,893, MAREK & SEIPLER, filed Aug. 26, 1991;

German Patent Disclosure DE 40 41 582.1 and corresponding U.S. Ser. No. 07/800,976, ROTHLEY, WOLF & ZABLER, filed Dec. 2, 1991;

German Patent Disclosure P 41 07 658.3 and corresponding U.S. Ser. No. 07/828,106, BECKER et al., filed Jan. 30, 1992;

CROSS-REFERENCE TO OTHER RELATED PATENTS

U.S. Pat. No. 4,398,342, PITT et al., Aug. 16, 1983, entitled METHOD OF MAKING A HALL EFFECT DEVICE;

U.S. Pat. No. 4,581,624, O'CONNER/ALLIED, Apr. 8, 1986, entitled MICROMINIATURE SEMICONDUCTOR VALVE;

U.S. Pat. No. 4,836,023, OIKAWA/YAZAKI CORP. Jun. 6, 1989, entitled VIBRATIONAL ANGULAR RATE SENSOR;

U.S. Pat. Nos. 4,549,926 and 4,578,142, CORBOY JR. et al/RCA; U.S. Pat. No. 4,585,513, GALE et al/-RCA, issued Apr. 29, 1986;

U.S. Pat. No. 4,658,495, FLATLEY & IPRI/RCA, issued Apr. 21, 1987;

U.S. Pat. No. 4,698,132, DENNIS/RCA, issued Oct. 6, 1987;

German Patent DE-PS 36 25 411, SEIDEL, Nov. 11, 1988, assigned to Messerschmidt-Bölkow-Blohm GmbH.

CROSS-REFERENCE TO RELATED LITERATURE

Walter Kern, "Chemical Etching of Silicon, Germanium, Gallium Arsenide, and Gallium Phosphide", RCA REVIEW, June 1978, Vol. 39, pp. 278-308.

W. C. Tang et al., "Laterally Driven Polysilicon Resonant Microstructures", Vol. 20, Sensors & Actuators, pages 53-59, IEEE 1989.

Anton Heuberger, "Mikromechanik" [Micromechanics] Springer-Verlag 1989, chapter 3.1.2, pp. 91-97.

FIELD OF THE INVENTION

The invention relates generally to a process for structuring a monocrystalline semiconductor substrate provided with some basic doping, in particular a silicon substrate with a (100) or (110) crystal orientation; at least one main surface of the semiconductor substrate is passivated by a structured masking layer, and in an etching step, etching into the semiconductor substrate anisotropically through openings in the masking layer.

BACKGROUND

Processes for producing n- and p-conductive layers in semiconductor crystals are described, for instance in "Mikromechanik" [Micromechanics] by Anton Heuberger, Springer-Verlag 1989, chapter 3.1.2, pp. 91-97, in which dopant atoms are purposefully incorporated at predetermined points of the crystal wafer. The doping can be done for instance either by diffusion in from the gas phase or from doped surface linings, or by injecting dopant atoms in the form of externally accelerated ions. Chapter 3.1.5, pp. 114-121, describes various technological processes for depositing monocrystalline silicon layers. In chapter 3.2.1.3, pp. 147-150, the etching process of silicon dioxide ($SiO_2$), and silicon nitride ($Si_3N_4$) in etchants that are anisotropic to silicon is described. Layers of this kind are typically used to passivate silicon surfaces. From chapter 3.2.1.4, page 151, it is known to use pn junctions, to which a voltage is applied, as an etch stop for anisotropic etchants, such as KOH and ethylenediamine solutions.

THE INVENTION

Briefly, a structured, preferably monocrystalline, layer of the basic material of the semiconductor substrate is applied as a structured masking layer to the at least one main surface, or produced by incorporating dopant atoms in the at least one main surface in the semiconductor body, and is doped in such a way that a pn junction is created between the masking layer and the semiconductor substrate; electrically insulated zones of the structured masking layer and semiconductor substrate are electrically bonded to one another, so that prior to the etching step, a voltage can be applied between the bonded zones of the masking layer and the semiconductor substrate, in such a way that the pn junction is polarized in the depletion direction and serves as an etch stop.

The process according to the invention has the advantage that using a surface masking layer of the same basic material as the semiconductor substrate avoids mechanical strains of the semiconductor substrate caused by the masking layer.

It is especially advantageous that the masking layer can be made by doping and deposition processes that are typical in microelectronics and micromechanics. A particular advantage of the process according to the invention is that the passivation of portions of the semiconductor substrate with respect to anisotropic etchants can be turned selectively on and off, by applying a voltage to the pn junction between the passivated portions of the semiconductor substrate and the semiconductor substrate. Accordingly, the masking layer need not be removed after the structuring of the semiconductor body; this simplifies the process. Another advantage is that in structuring by the process of the invention, masking planes can be dispensed with, particularly when structures with defined doped zones are produced. Both the etching mask and the definedly doped zones can be produced in the same mask plane.

In another embodiment of the process, the semiconductor substrate is formed of a monocrystalline substrate provided with a basic doping and at least one monocrystalline layer applied to it, of the same basic material as the substrate; from parts of at least one main surface of the substrate, dopants are incorporated into the substrate in such a way that zones are produced on the at least one main surface of the substrate; pn junctions are created between the zones and the substrate, and then the at least one layer is applied to the at least one main surface of the substrate so that the zones are disposed in the interior of the semiconductor substrate; dopants are incorporated into the layer for electrically bonding the zones, and electrically insulated zones and the semiconductor substrate are bonded electrically so that prior to the etching step, a voltage can be applied between the bonded zones and the semiconductor substrate in such a way that the pn junctions are polarized in the depletion direction and serve as an etch stop for deep etching.

This has the further advantage that by defining buried zones in the semiconductor substrate, with pn junctions between zones and the semiconductor substrate, new etching geometries can be produced. For instance, paddles capable of vibrating can be made in the depth of the semiconductor substrate.

Other advantageous features of the invention have the advantage that structures can be purposefully undercut in the semiconductor substrate by suitable orientation of the masking layer and the buried zones.

DRAWINGS

FIGS. 1a and b show various ways the process according to the invention can be used for passivating surfaces, and FIGS. 2a–e and 3a–c show a semiconductor substrate in various stages of the process according to the invention for passivating buried zones.

DETAILED DESCRIPTION

Figure 1A:
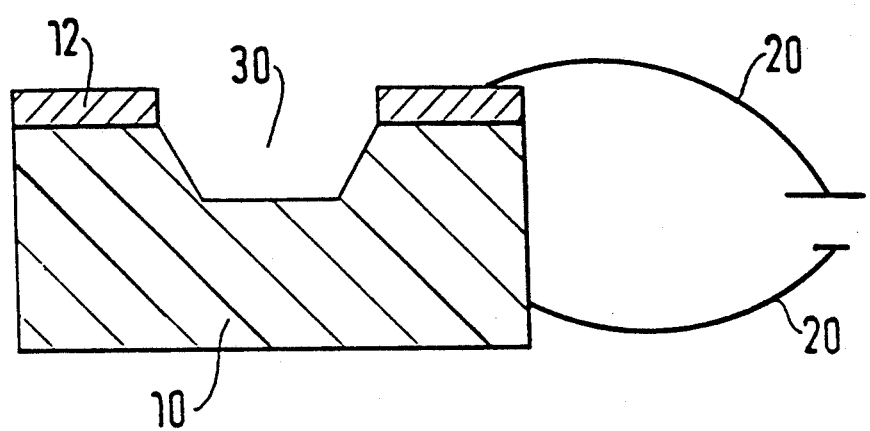
Figure 1B:
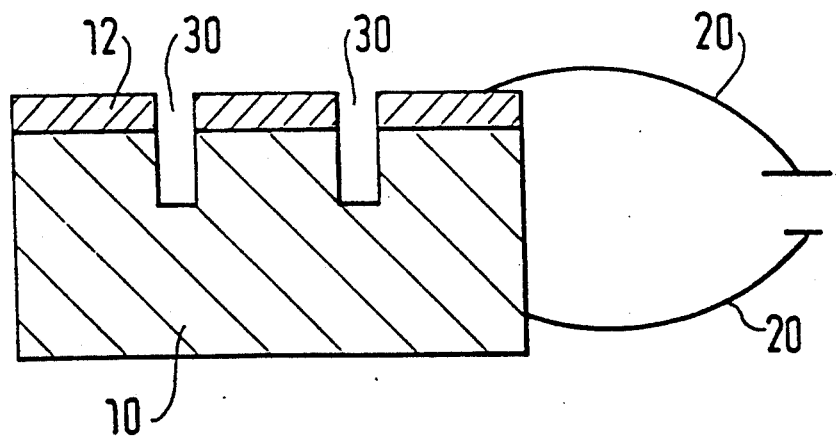

FIGS. 1a and 1b each show semiconductor substrates 10; in both FIGS. 1a and 1b, one main surface of the semiconductor substrate 10 has been provided with a structured passivation layer 12. In both examples, etching has been done through openings in the structured masking layer 12 by means of an anisotropic etchant, producing etched recesses 30. The semiconductor substrates in these exemplary embodiments are monocrystalline silicon substrates that are provided with a basic doping. FIG. 1a shows a silicon substrate 10 with a (100) crystal orientation; in FIG. 1b there is a silicon semiconductor substrate 10 with a (110) crystal orientation, which explains the different geometries of the etched recesses 30. Typically, the basic doping of silicon wafers is a p-doping, but an n-doping would also be conceivable. The masking layers 12, according to the invention, are layers of the same material as the semiconductor substrate 10, or in this case monocrystalline silicon layers, although they differ in doping from the semiconductor substrate 10. Between the masking layer 12 and the semiconductor substrate 10 is a pn junction t which a voltage can be applied via an electrical bond 20. The intensity of the voltage applied is selected, as a function of the ratio between the dopings of the masking layer 12 and the semiconductor substrate 10, such that the pn junction acts as an etching stop limit when the voltage is applied in the depletion direction. The etch-stopping action of the pn junction between the masking layer 12 and the semiconductor substrate 10 can accordingly be selectively turned on and off by applying or turning off the voltage between the masking layer 12 and the semiconductor substrate 10. For example, the masking layer can be produced by the diffusion of dopant atoms in from the gas phase or from doped surface linings or by injecting dopant atoms in the form of externally accelerated ions.

In this process, the regions of the surface of the semiconductor substrate 10 in which openings are to be disposed in the masking layer, are protected against the diffusion or implantation of dopant atoms. A further option for surface masking is to deposit a structured epitaxial layer with suitable doping on the main surface, to be masked, of the semiconductor substrate 10. The essential factor is that a pn transition exist between the masking layer 12 and the semiconductor substrate 10, and that the masking layer 12 is monocrystalline and comprises the same basic material as the semiconductor substrate 10. With suitable orientation of the openings in the masking layer 12 with respect to the crystal orientation of the semiconductor substrate 10, undercutting of the masking layer 12 does not occur; this is shown in FIGS. 1a and 1d.

FIGS. 2a–d show various stages of the structuring process according to the invention with buried doping zones.

Figure 2A:
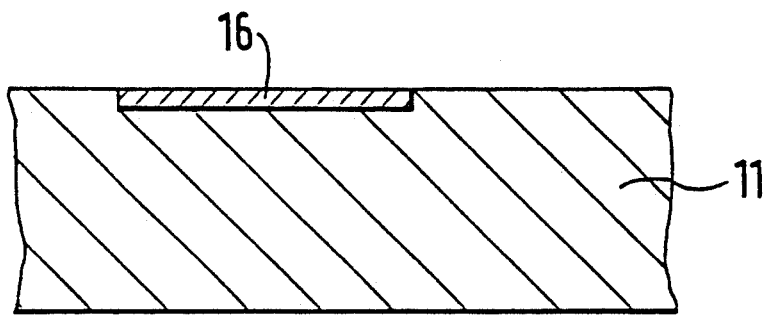

FIG. 2a shows a monocrystalline semiconductor substrate 11 having a basic doping. In a zone 16 of a main surface of the monocrystalline substrate 11, a dopant is incorporated, so that a pn junction exists between the zone 16 and the semiconductor substrate 11. The semiconductor substrate may for instance be a silicon wafer provided with a p-basic doping, but it may also be a differently doped semiconductor substrate comprising some other basic materials and silicon.

Next, on the surface of the substrate 11 provided with the doped region 16, a monocrystalline semiconductor layer 13 is deposited, which comprises the same basic material as the substrate 11 and in this example has a basic doping of the same type as the substrate 11. In the case of a monocrystalline silicon wafer with a p-type basic doping, the layer 13 may for instance be formed by a p-doped epitaxial layer. The substrate 11, together with the layer 13, form the semiconductor substrate 10.

Figure 2B:
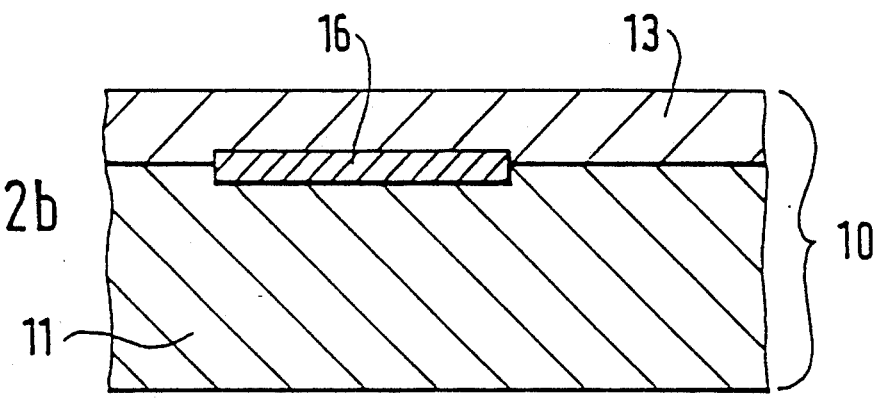

In FIG. 2b, the semiconductor substrate is shown after the out-diffusion of the dopant 16 into the layer 13. For bonding the buried zone 16, which in the example is n-doped, a lead diffusion 14 is incorporated into the surface of the semiconductor substrate 10, which is shown in FIG. 2c.

Figure 2C:
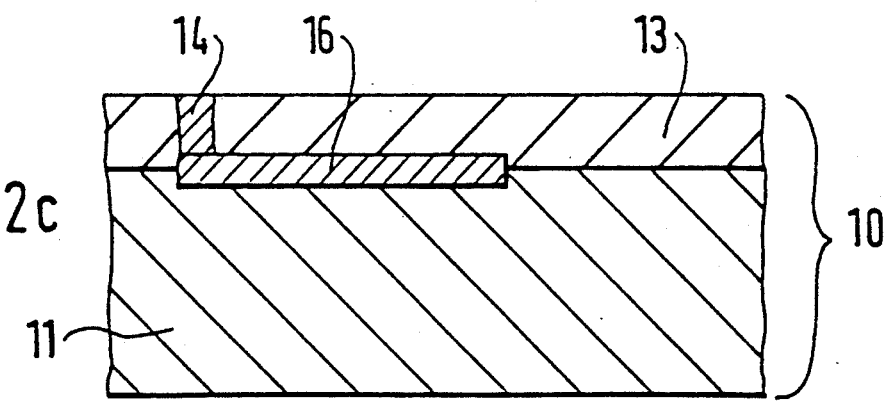
Figure 2D:
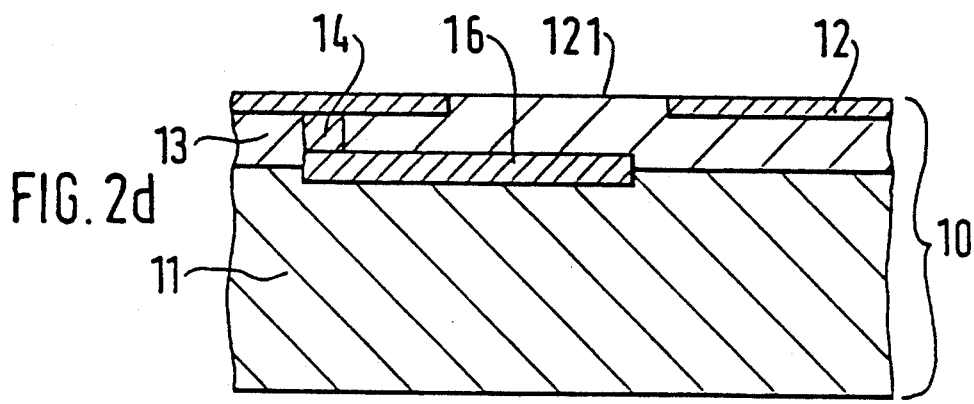
Figure 2E:
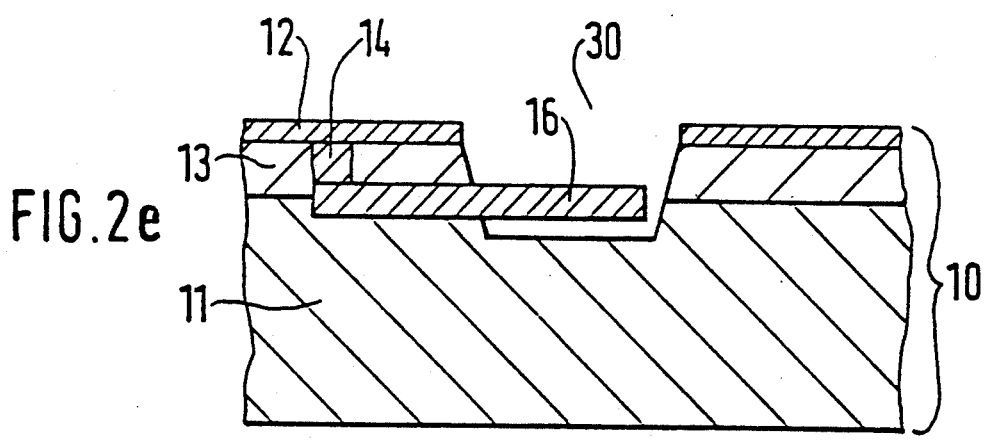

FIG. 2d shows the semiconductor substrate 10 after the incorporation of a masking layer 12 of FIG. 1a into the surface of the semiconductor substrate 10. The masking layer 12 has an opening 121, through which an anisotropic etchant can act upon the semiconductor substrate 10. Upon application of a voltage in the depletion direction to the pn junction between the masking layer 12 and the buried zone 16 via the lead diffusion 14 against the semiconductor substrate 10, the zone 16 is passivated against a deep etching. With suitable orientation of the zone 16 with respect to the crystal orientation of the semiconductor substrate 10, a structure as in FIG. 2e is created in the deep etching. The anisotropic etchant, which acts upon the semiconductor substrate 10 through the opening 121, produces an etched recess 30 having an undercut of the buried zone 16, so that a vibratable paddle is created in the depth of the semiconductor substrate 10.

Figure 3A:
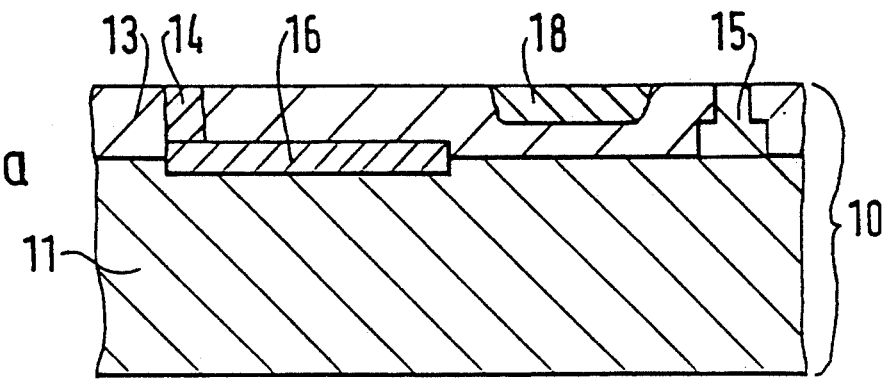
Figure 3B:
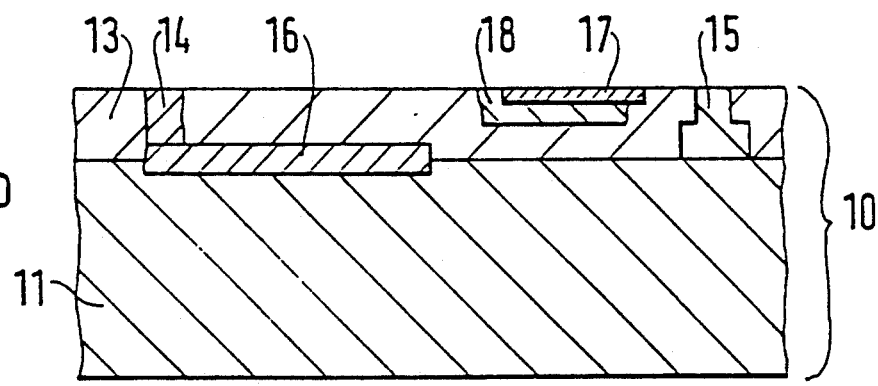
Figure 3C:
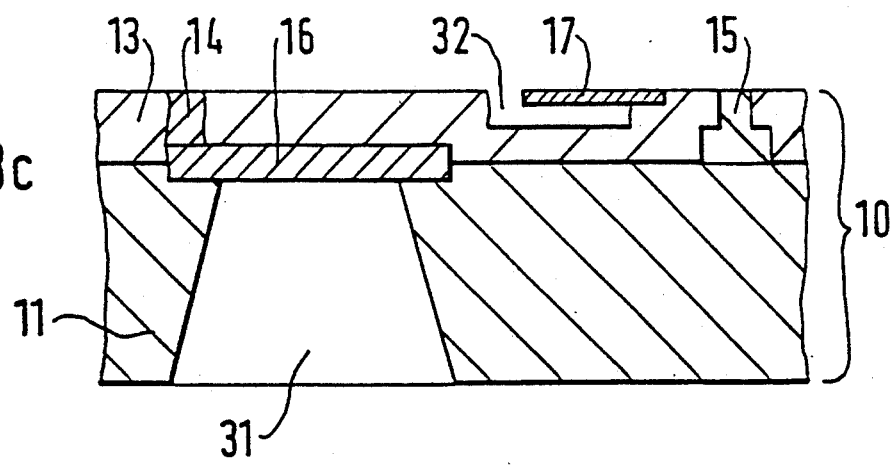

FIGS. 3a–c shows a further variant of the process of FIGS. 2a–e. FIGS. 3a shows a semiconductor substrate 10, which is likewise formed of a substrate 11 and an epitaxial layer 13 applied to it. A buried doped zone 16 is located at the layer boundary between the substrate 11 and the epitaxial layer 13, and this zone can be bonded by a lead diffusion 14, beginning at one main surface of the semiconductor substrate. This design of the semiconductor body 10 out of the substrate 11 and the layer 13 applied thereto with the buried zone 16 and the lead diffusion 14 was created as shown in FIGS. 2a–c.

In contrast to the exemplary embodiment shown in FIG. 2, however, the layer 13 has a doping of the opposite type to that of the substrate 11, so that there is a pn junction between the layer 13 and the substrate 11. The accuracy with which this pn junction can be located in the depth of the semiconductor substrate 10 depends on the ratio of the dopants of the substrate 11 and the layer 13 applied to it. The buried zone 16 with the lead diffusion 14 has a dopant of the same type as the epitaxial layer 13, but is substantially more highly doped. As a result, the pn junction between the buried zone 16 and the substrate 11 is defined substantially more sharply than that between the substrate 11 and the layer 13. Moreover, the pn junction between the buried zone 16 and the substrate 11 is disposed at a greater depth in the semiconductor body 10 than the pn junction between the epitaxial layer 13 and the substrate 11. A dopant of the type of the substrate 11 is also incorporated into the surface of he layer 13, in a zone 18. A further dopant 15 of the type of the substrate 11 serves as a lead diffusion of the substrate 11 through the layer 13. In a next method step, in a zone 17, which at least partially overlaps the zone 18, a dopant of the opposite type to the dopant of the zone 18 is incorporated, so that there is a pn junction between the zone 18 and portions of the zone 17.

This is shown in FIG. 3b. Via the lead diffusion 14 and 15, a voltage is now applied in the depletion direction to the pn junction between the zone 16 and the substrate 11. In the exemplary embodiment shown in FIG. 3, this pn junction polarized in the depletion direction serves as an etch stop limit for a back side etching, carried out in adjusted fashion against the buried zone 16, in the course of which a recess 31 is created.

In this way, it is very simple to generate membranes of a defined thickness, by incorporating a strong dopant into a substrate and then depositing a layer to a defined thickness, in the course of which a sharply defined pn junction between the substrate and the buried dopant is created. Between the zones 17 and the 18 as well, a voltage is applied such that the pn junction between these zones is polarized in the depletion direction. By means of an ensuing anisotropic etching step, the zone 17 can then be purposefully undercut by etching out the zone 18, so that a paddle structure is created in the surface of the semiconductor substrate 10, as shown in FIG. 3c.

Various changes and modification may be made, and features described in connection with any one of the embodiments may be used with any of the others, within the scope of the inventive concept.

We claim:

1. A process for structuring a monocrystalline semiconductor substrate, provided with a basic doping, said substrate having a (100) or (110) crystal orientation, comprising the steps of
    passivating at least one main surface of the semiconductor substrate by means of a structured masking layer,
    forming said substrate (10) and said masking layer (12) into zones of differing conductivity type, thereby defining a pn-junction therebetween;
    applying a voltage across said pn-junction to thereby polarize said junction in a depletion direction to serve as an etch stop; and
    etching into the semiconductor substrate anisotropically through openings in the masking layer while said voltage is applied to said pn junction.

2. The method of claim 1,
    characterized in that
    the structured masking layer (12) is produced by diffusion of dopant atoms in from the gas phase or from doped surface linings or by injecting dopant atoms in the form of externally accelerated ions, in the region of the at least one main surface of the semiconductor substrate (10).

3. The method of claim 1,
    characterized in that
    the structured masking layer (12) is deposited as a selective epitaxial layer on regions of the at least one main surface of the semiconductor substrate (10).

4. The method of claim 1,
    characterized in that
    the opening in the masking layer (12) are oriented in such a way with respect to the crystal orientation of the semiconductor substrate (10) that when an anisotropic etchant is used, no undercutting of the masking layer (12) occurs.

5. The method of claim 1,
    characterized in that
    the openings in the masking layer (12) are oriented in such a way the masking layer (12) is undercut by an anisotropic etchant, so that vibratable structures in the masking layer (12) can be exposed.

6. A process for structuring a monocrystalline semiconductor substrate, provided with a basic doping, in particular a silicon substrate with (100) or (110) crystal orientation, in which at least one main surface of the semiconductor substrate is passivated by means of a structured masking layer, and in which in an etching step, etching into the semiconductor substrate is done anisotropically through openings in the masking layer, characterized in that the semiconductor substrate (10) is formed of a monocrystalline substrate (11), provided with a basic doping, and at least one monocrystalline layer (13), applied thereto, of the same basic material of the substrate (11), in that first, dopants originating in portions of at least one main surface of the substrate (11) are incorporated into the substrate 11) in such a way that zones (16) on the at least one main surface of the substrate (11) are produced, pn junctions being produced thereby between the zones (16) and the substrate (11), and then the at least one layer (13) is applied onto the at least one main surface of the substrate (11), so that the zones (16) are disposed in the interior of the semiconductor substrate (10);

that dopants (14) for electrical bonding of the zones (16) are incorporated into the layer (13); and that zones (16), electrically insulated from one another, and semiconductor substrate (10) are electrically bonded, so that prior to the etching step between the bonded zones (16) and semiconductor substrate (10), in such a manner that the pn junctions are polarized in the depletion direction and serve as an etch stop for a deep etching.

7. The method of claim 6, characterized in that the voltage that is applied to a pn junction in order to generate an etch-stopping action is selected as a function of the dopant ratio of the layers between which the pn junction is located.

8. The method of claim 7, characterized in that the etch-stopping action of a pn junction can be selectively turned on and off during the etching step by the application and turning off of the voltage at the pn junction.

9. The method of claim 6, characterized in that one or more zones (16) are disposed in such a way with respect to an etched recess (30) to be produced that the zones (16) can at least partially be undercut by an anisotropic etchant, so that they form structures capable of vibration in the depth of the semiconductor substrate (10).

10. The method of claim 7, characterized in that one or more zones (16) are disposed in such a way with respect to an etched recess (30) to be produced that the zones (16) can at least partially be undercut by an anisotropic etchant, so that they form structures capable of vibration in the depth of the semiconductor substrate (10).

11. The method of claim 8, characterized in that one or more zones (16) are disposed in such a way with respect to an etched recess (30) to be produced that the zones (16) can at least partially be undercut by an anisotropic etchant, so that they form structures capable of vibration in the depth of the semiconductor substrate (10).

* * * * *